United States Patent
Abbas et al.

(10) Patent No.: US 12,164,850 B2
(45) Date of Patent: Dec. 10, 2024

(54) SYSTEM AND METHOD FOR ANALOG DESIGN SYNTHESIS USING ANALOG CELL COMPONENT LIBRARY BASED ON AI/ML

(71) Applicant: INTERNATIONAL INSTITUTE OF INFORMATION TECHNOLOGY, HYDERABAD, Hyderabad (IN)

(72) Inventors: Zia Abbas, Hyderabad (IN); Koushik De, Hyderabad (IN)

(73) Assignee: INTERNATIONAL INSTITUTE OF INFORMATION TECHNOLOGY, HYDERABAD, Hyderabad (IN)

( * ) Notice: Subject to any disclaimer, the term of this patent is extended or adjusted under 35 U.S.C. 154(b) by 542 days.

(21) Appl. No.: 17/483,764

(22) Filed: Sep. 23, 2021

(65) Prior Publication Data

US 2022/0092246 A1 Mar. 24, 2022

(30) Foreign Application Priority Data

Sep. 23, 2020 (IN) .............................. 202041041297

(51) Int. Cl.
*G06F 30/373* (2020.01)
*G06F 30/367* (2020.01)
*G06N 20/00* (2019.01)

(52) U.S. Cl.
CPC .......... *G06F 30/373* (2020.01); *G06F 30/367* (2020.01); *G06N 20/00* (2019.01)

(58) Field of Classification Search
CPC ...... G06F 30/30; G06F 30/327; G06F 30/323; G06F 30/373; G06F 30/367; G06F 30/27; G06N 20/00
USPC ........................................................ 716/106
See application file for complete search history.

(56) References Cited

U.S. PATENT DOCUMENTS

| 5,883,814 A * | 3/1999 | Luk ......................... G06F 30/30 716/120 |
| 11,055,463 B1 * | 7/2021 | Prasad .................. G06F 30/373 |

\* cited by examiner

*Primary Examiner* — Paul Dinh

(57) ABSTRACT

A system and method for synthesizing analog design in real-time using an artificial intelligence and machine learning (AI/ML) model are provided. The method includes (i) generating a behavioral model of an analog macro using the AI/ML model; (ii) determining one or more operations that is required to implement the behavioral model by scanning the behavioral model; (iii) selecting, using the AI/ML model, the analog macro based on at least one specification that corresponds to the analog macro; (iv) synthesizing, the analog macro that is selected by the AI/ML model 214 and one or more leaf cells for each selected analog macro of the behavioral architectural implementation to obtain a gate-level circuit design based on a figure of merit (FoM) of the analog macro and (v) determining, using the AI/ML model, the analog circuit design for the integrated circuit system based on the gate level circuit design that is synthesized.

17 Claims, 6 Drawing Sheets

| LIBRARY | CATEGORY | CELL | VIEW | SPECIFICATIONS |
|---|---|---|---|---|
| analog Macro | ☐ Everything<br>☐ Uncategorised<br>✓ Opamps<br>☐ Opamps_Comp<br>☐ Comparators<br>☐ Comparators_Comp<br>☐ OTAs<br>☐ OTA_Comp<br>☐ Current mirrors<br>☐ Level shifters | ☐ Single-Stage<br>☐ 2Stage<br>☐ Cascode<br>✓ Folded_Cascode<br>☐ Miller_OP<br>☐ Differential_1<br>☐ Diff_FC | ☐ Schematic<br>☐ Symbol<br>☐ Verilog<br>☐ Behavioral<br>☐ VerilogA<br>☐ Layout<br>☐ RCExt<br>☐ CExt | Selected component major specs would appear here:<br>1. Gain range<br>2. UGB<br>3. ICMR<br>4. PSRR<br>5. PM<br>6. Id<br>7. Area |

Messages:
- Usage notes would be appearing here
- Maturity information of the cell would be of interest to users
- Reliability info would be covered here

| LIBRARY | CATEGORY | CELL | VIEW | SPECIFICATIONS |
|---|---|---|---|---|
| | ☐ Everything | ☐ Bias_1 | ☐ Schematic | Selected component major specs would appear here: |
| | ☐ Uncategorised | ☐ Bias_2 | ☐ Symbol | |
| | ☐ Opamps | ☐ Bias_3 | ☐ Verilog | 1. Gain range |
| analog Macro | ✓ Opamps_Comp | ✓ Input_Diff_1 | ☐ Behavioral | 2. UGB |
| | ☐ Comparators | ☐ Input_Diff_2 | ☐ VerilogA | 3. ICMR |
| | ☐ Comparators_Comp | ☐ Output_buff_1 | ☐ Layout | 4. PSRR |
| | ☐ OTAs | ☐ Output_buff_1 | ☐ RCExt | 5. PM |
| | ☐ OTA_Comp | | ☐ CExt | 6. Id |
| | ☐ Current mirrors | | | 7. Area |
| | ☐ Level shifters | | | (Applicable specs only) |

Messages:
- Usage notes would be appearing here
- Maturity information of the cell would be of interest to users
- Reliability info would be covered here

SYSTEM AND METHOD FOR ANALOG DESIGN SYNTHESIS USING ANALOG CELL COMPONENT LIBRARY BASED ON AI/ML

CROSS-REFERENCE TO RELATED APPLICATIONS

This patent application claims priority to Indian provisional patent application no: 202041041297 filed on Sep. 23, 2020, the complete disclosures of which, in their entirety, are hereby incorporated by reference.

BACKGROUND

Technical Field

The embodiments herein generally relate to synthesizing an analog design, more particularly, a system and method for synthesizing the analog design in real-time using an artificial intelligence/machine learning (AI/ML) model.

Description of the Related Art

Analog circuit design synthesis is of great importance in electronic system design. Analog circuit design includes circuit topology design and component values design. These two aspects are essential for evolving design in analog circuits. However, traditional systems and methods are not very efficient in evolving circuit component values. Because of the difficulties in, reconciling the simplified models for synthesis and industrial-strength simulation environments for validation, earlier generations of analog synthesis tools primarily failed to migrate into mainstream usage. Recently seen methods comprise the emergence of synthesis tools that can bias a fixed circuit topology by exploiting the same simulation environment created to validate the sized circuit. These methods work remarkably well across a range of difficult analog circuits, and are augmented with suitable models, and also have been applied successfully to system-level designs.

Standard cell methodology is used in producing high-speed digital design. Various digital custom blocks are produced that implemented common logic functions and memory elements. Large, complex circuits are made up of a combination of custom blocks and they are all connected by metal routing. The advantage is that blocks or cells can be easily placed and routed manually.

Due to its inherent nature, analog design fundamentally has several interrelationships among related design parameters, critical design tolerances requirements, weaknesses of components, greater sensitivity to process factors, and other environmental variables. Hence legacy design methodology has not been able to adequately cover all these areas, unlike digital design synthesis methodology. The existing systems use structured simulation-based analog design synthesis lacks components/cells for cell-level synthesis.

Therefore, there arises a need to address the aforementioned technical drawbacks in existing technologies in the synthesis of analog design.

SUMMARY

In view of foregoing an embodiment herein provides a processor-implemented method for determining an analog circuit design for an integrated circuit system using an artificial intelligence/machine learning (AI/ML) model. The processor-implemented method includes generating a behavioral model of an analog macro using the AI/ML model. The processor-implemented method includes determining at least one operation that is required to implement the behavioral model by scanning the behavioral model of the analog macro, the at least one operation is configured with one or more analog macro blocks to a behavioral architectural implementation. The processor-implemented method includes selecting, using the AI/ML model, the analog macro based on at least one specification that corresponds to the analog macro, the at least one specification includes required components for the analog macro, the analog macro includes one or more leaf cells. The processor-implemented method includes synthesizing, the analog macro that is selected by the AI/ML model and one or more leaf cells for each selected analog macro of the behavioral architectural implementation to obtain a gate-level circuit design based on a figure of merit (FoM) of the analog macro, the analog macro that is selected is used for synthesizing whose FoM is above a threshold optimum FoM for the analog circuit design. The processor-implemented method includes determining, using the AI/ML model, the analog circuit design for the integrated circuit system based on the gate level circuit design that is synthesized.

In some embodiments, the processor-implemented method further includes selecting layout views for each leaf cell of the analog macro and performing physical checks on the analog circuit design.

In some embodiments, the processor-implemented method further includes optimizing the FoM of the analog macro that is selected if the FoM of the analog circuit design is below the threshold optimum FoM to obtain an optimized analog macro.

In some embodiments, the processor-implemented method further includes classifying frequently used analog macros of the same type in several analog circuit designs based on a circuit topology, each analog circuit design has the same functionality even though the frequently used analog macros are used for different purposes.

In some embodiments, the processor-implemented method further includes applying a functional verification to the gate level circuit design that is synthesized using the optimized analog macro.

In some embodiments, the processor-implemented method further includes training the AI/ML model by correlating historical optimized analog macros with historical analog circuit designs based on the threshold optimum FoM.

In some embodiments, the processor-implemented method further includes converting one or more leaf cells for the analog circuit design into a real-time model by, (i) capturing a typical analog circuit design and centering the analog circuit design with an operating point within a desired margin; and (ii) for a typical design targeting, capturing its behavior across all possible combinations of direct and indirect factors from a different simulation.

In some embodiments, the processor-implemented method further includes generating a simulation matrix tree by running a regression of simulations in a pre-defined template, each leaf cell includes one or more inputs and outputs that exposure to different processes, supply voltage, temperature conditions for each leaf cell.

In another aspect, there is provided one or more non-transitory computer-readable storage mediums storing one or more sequences of instructions, which when executed by one or more processors, causes a method for determining an analog circuit design for an integrated circuit system using an artificial intelligence/machine learning (AI/ML) model. The method includes generating a behavioral model of an analog macro using the AI/ML model. The method includes determining at least one operation that is required to implement the behavioral model by scanning the behavioral model of the analog macro, the at least one operation is configured with one or more analog macro blocks to a behavioral architectural implementation. The method includes selecting, using the AI/ML model, the analog macro based on at least one specification that corresponds to the analog macro, the at least one specification includes required components for the analog macro, the analog macro includes one or more leaf cells. The method includes synthesizing, the analog macro that is selected by the AI/ML model and one or more leaf cells for each selected analog macro of the behavioral architectural implementation to obtain a gate-level circuit design based on a figure of merit (FoM) of the analog macro, the analog macro that is selected is used for synthesizing whose FoM is above a threshold optimum FoM for the analog circuit design. The method includes determining, using the AI/ML, model, the analog circuit design for the integrated circuit system based on the gate level circuit design that is synthesized.

In another aspect, a system for determining an analog circuit design for an integrated circuit system using an artificial intelligence/machine learning (AI/ML) model is provided. The system includes a server that is communicatively coupled with a user device associated with a user. The server includes a memory that stores a set of instructions, and a processor that executes the set of instructions and is configured to, (i) generate a behavioral model of an analog macro using the AI/ML model; (ii) determine at least one operation that is required to implement the behavioral model by scanning the behavioral model of the analog macro, the at least one operation is configured with one or more analog macro blocks to a behavioral architectural implementation; (iii) select, using the AI/ML model, the analog macro based on at least one specification that corresponds to the analog macro, the at least one specification includes required components for the analog macro, the analog macro includes one or more leaf cells; (iv) synthesize, the analog macro that is selected by the AI/ML model and one or more leaf cells for each selected analog macro of the behavioral architectural implementation to obtain a gate level circuit design based on a figure of merit (FoM) of the analog macro, the analog macro that is selected is used for synthesizing whose FoM is above a threshold optimum FoM for the analog circuit design; and (v) determine, using the AI/ML model, the analog circuit design for the integrated circuit system based on the gate level circuit design that is synthesized.

In some embodiments, the system further includes selecting layout views for each leaf cell of the analog macro and performing physical checks on the analog circuit design.

In some embodiments, the system further includes optimizing the FoM of the analog macro that is selected if the FoM of the analog circuit design is below the threshold optimum FoM to obtain an optimized analog macro.

In some embodiments, the system further includes classifying frequently used analog macros of the same type in several analog circuit designs based on a circuit topology, each analog circuit design has the same functionality even though the frequently used analog macros are used for different purposes.

In some embodiments, the system further includes applying a functional verification to the gate level circuit design that is synthesized using the optimized analog macro.

In some embodiments, the system further includes training the AI/ML model by correlating historical optimized analog macros with historical analog circuit designs based on the threshold optimum FoM.

In some embodiments, the system further includes converting one or more leaf cells for the analog circuit design into a real-time model by, (i) capturing a typical analog circuit design and centering the analog circuit design with an operating point within a desired margin; and (ii) for a typical design targeting, capturing its behavior across all possible combinations of direct and indirect factors from a different simulation.

In some embodiments, the system further includes generating a simulation matrix tree by running a regression of simulations in a pre-defined template, each leaf cell includes one or more inputs and outputs that expose to a different process, supply voltage, temperature conditions for each leaf cell.

The system provides fast design, optimization, and alignment of analog macros with synthesis from analog behavioral models based on the custom design specification. Sometimes depending on human efficiency and design intuition, conventional analog design optimization needs a detailed analysis and many iterations. But analog compiler-based design with the use of analog standard cell components may enable programmable design adaptation for changing requirements with less turn-around time taking advantage of re-usage of proven components. Quick design prototyping of analog macros is used to build a large and complex analog solution in cutting-edge nanoscale technology nodes. The system provides an efficient solution for effective analog behavioral model generation and enables compiler-based design for analog blocks. Unlike the digital system, AI/ML be used to create a design synthesis flow for an efficient analog design that delivers the best FoM by using component leaf cells from an analog standard cell library These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 4A illustrates an exemplary representation of the analog macro according to some embodiments herein;

FIG. 4B illustrates an exemplary representation of a leaf cell organization in the analog macro according to some embodiments herein.

DETAILED DESCRIPTION OF PREFERRED EMBODIMENTS

Figure 1:
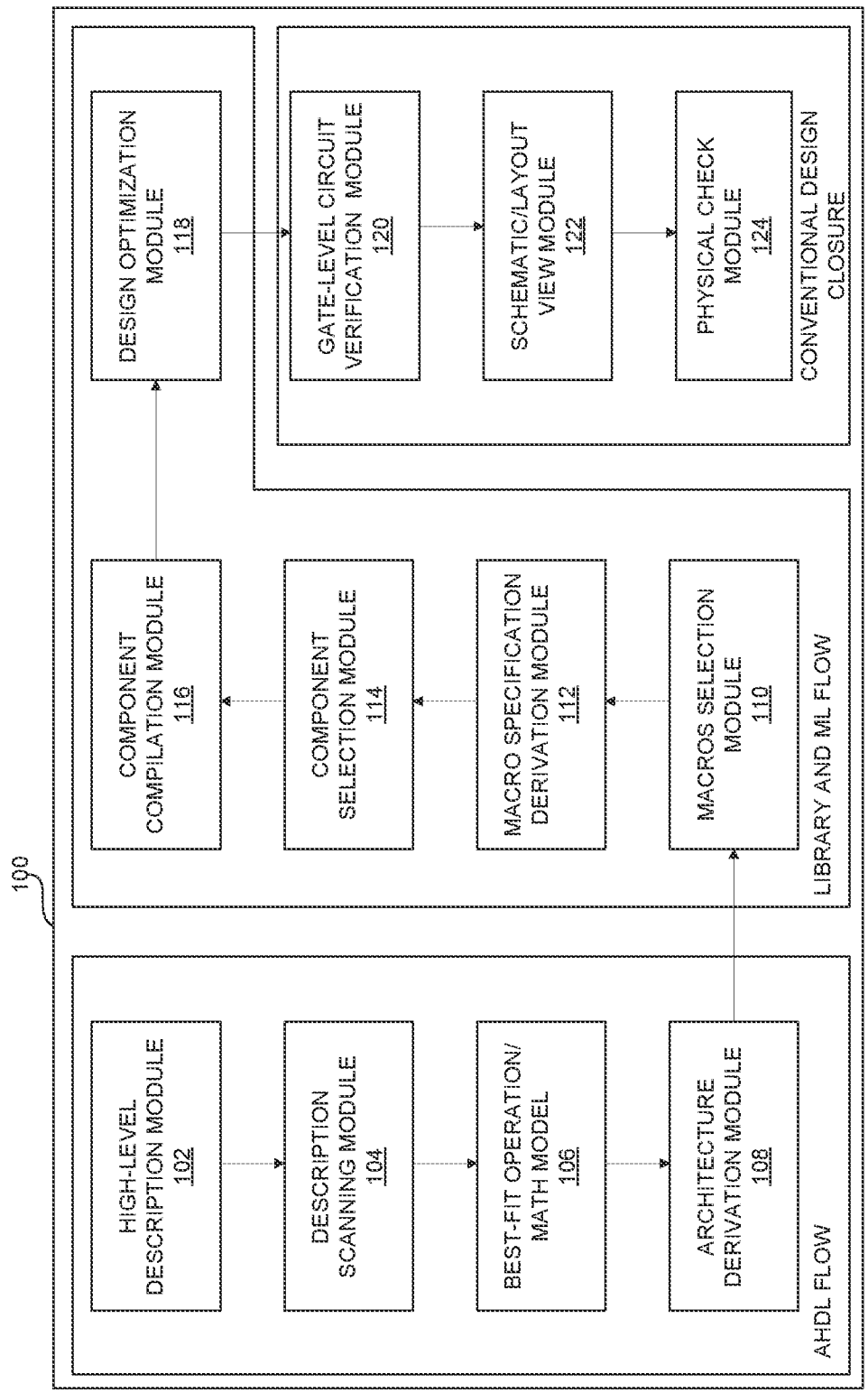
FIG. 1 is a block diagram that illustrates a system for determining an analog circuit design for an integrated circuit system using an artificial intelligence/machine learning (AI/ML) model according to some embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a system and method for more potential of evolutionary methods on an analog circuit design. The embodiment herein achieves this by determining the analog circuit design for an integrated circuit system using a machine learning (ML) model. Referring now to the drawings, and more particularly through FIG. 1 to FIG. 5, where similar reference characters denote corresponding features consistently throughout the figures, there are shown preferred embodiments.

FIG. 1 is a block diagram of a system 100 for determining an analog circuit design for an integrated circuit system using an artificial intelligence/machine learning (AI/ML) model according to some embodiments herein. The system 100 includes a high-level description module 102, a description scanning module 104, a best fit operation/math model 106, an architecture derivation module 108, a macros selection module 110, a macro specification derivation module 112, a component selection module 114, a component compilation module 116, a design optimization module 118, a gate-level circuit verification module 120, a schematic/layout view module 122, and a physical check module 124.

In some embodiments, the system 100 is a local server or an application server, or a web server. In some embodiments, the high-level description module 102 obtains a high-level description from a user through a user device through a network. In some embodiments, the user device, without limitation, is selected from a mobile phone, a Personal Digital Assistant (PDA), a tablet, a desktop computer, or a laptop. In some embodiments, the network is a wireless network. In some embodiments, the network is a combination of a wired network and a wireless network. In some embodiments, the network is the Internet.

The high-level description module 102 generates a behavioral model of an analog macro design using the artificial intelligence and machine learning (AI/ML) model in a pre-defined format. In some embodiments, the analog macro is selected from, without limitation, a data converter, a temperature sensor, a power management circuit, etc. In some embodiments, the pre-defined format used to generate the default behavioral model is selected from a VerilogA format or other Hardware description language (HDL) supported formats. In some embodiments, the flow is driven by Altera hardware description language (AHDL). The description scanning module 104 scans the behavioral model to determine one or more operation that is required for implementation.

The best-fit operations/math model 106 configures the one or more operations that is required for the implementation of the behavioral model. The architecture derivation module 108 derives an architecture based on the at least one configured operation for the analog macro. The selection of macros module 110 selects a suitable analog macro for the behavioral model using the AI/ML model. In some embodiments, frequently used analog macros of the same type are classified in several prototypes based on circuit topology. In some embodiments, each prototype provides the same functionality but has different purposes that are suited for the end application. In some embodiments, each prototype uses different leaf level cells or the same cells used in other prototypes within a single macro family.

The macro specification derivation module 112 derives the specifications of a selected analog macro. The selected macros select components/leaf cells. In some embodiments, the selection of suitable analog macro and its specification details is driven by the AI/ML model. In some embodiments, the selection of suitable analog macro provides an effective design solution with the highest figure of merit (FoM). In some embodiments, specification details of the analog macro decide the exact required components of the macro, for example, to construct an amplifier, choosing between a two-stage operational amplifier (op-amp) or a folded cascade op-amp is determined based on the analog macro and its specification details. In some embodiments, the one or more leaf cells/components include independent and dependent parameters.

In some embodiments, the one or more leaf cells/components are converted into an accurate real-time model by (i) capturing a typical prototype and centering the design with an operating point within the desired margin, and (ii) capturing its behavior across all possible combinations of direct and indirect factors from different simulations for typical design targeting. In some embodiments, frequently used analog macros of the same type are classified in several prototypes based on circuit topology. In some embodiments, each prototype provides the same functionality but has different purposes that are suited for the end application. In some embodiments, each prototype uses different leaf level cells or the same cells used in other prototypes within a single macro family. In some embodiments, the reuse of one or more leaf cells reduces design risk and improves design yield. In some embodiments, an efficiency or accuracy from the ML model is dependent on simulation data correlation between different interdependent parameters, capturing reliability information, yield information. In some embodiments, the simulation matrix tree for an elementary leaf cell has many such combinations and are covered by performing regression of simulations in a template.

The component/leaf cell selection module 114 selects the one or more leaf cells based on each selected macro using the AI/ML model. In some embodiments, the one or more leaf components are selected from a library of macros using the AI/ML model. In some embodiments, the AI/ML model uses a set of simulation outcomes. In some embodiments, the one or more leaf cells, for example, independent parameters in the analog circuit design synthesis, for example, a supply voltage (V), a temperature (T), a width (W), a length (L) of each device in the analog circuit design synthesis and dependent parameters include, biasing of one or more nodes, one or more current relationships in the analog circuit design synthesis. In some embodiments, the reuse of one or more leaf cells reduces design risk and improves design yield. In some embodiments, the one or more leaf cells are used to implement the arithmetic functions for a generated behavioral model. The component/leaf cell compilation module 116 compiles the selected components/leaf cells of the analog circuit design synthesis through derived specifications from macro.

The design optimization module 118 optimizes the derived architecture with the selected macros and the one or more leaf cells by checking whether the selected macros have the optimum FoM. In some embodiments, the one or more leaf cells are updated if the selected macros do not have the optimum FoM. In some embodiments, an optimization test is held based on some factors such as expenses, size of design, effectiveness, complexity. In some embodiments, the selected macro does not have optimized FoM. In some embodiments, frequently used analog macros of the same type is classified in different library prototypes based on the circuit topology. In some embodiments, each prototype provide the same functionality but have different purposes, best suited for different applications in the analog circuit design synthesis.

The gate-level circuit verification module 120 verifies a gate-level circuit design from optimized macros and applies a functional verification to the synthesized gate-level circuit design.

The schematic/layout view module 122 selects layout views for each leaf cell. In some embodiments, each leaf cell includes a layout view affecting the layout view of the whole macro, such schematic or layout views are used to prepare an effective layout view for the analog macro. The physical check module 124 performs physical checks on analog circuit design. In some embodiments, the physical checks include layout vs schematic checks (LVS), Physical rule violation check (DRC), yield prediction is conducted using few tests such as a design for manufacturability (DFM), in a standard design flow.

Figure 2:
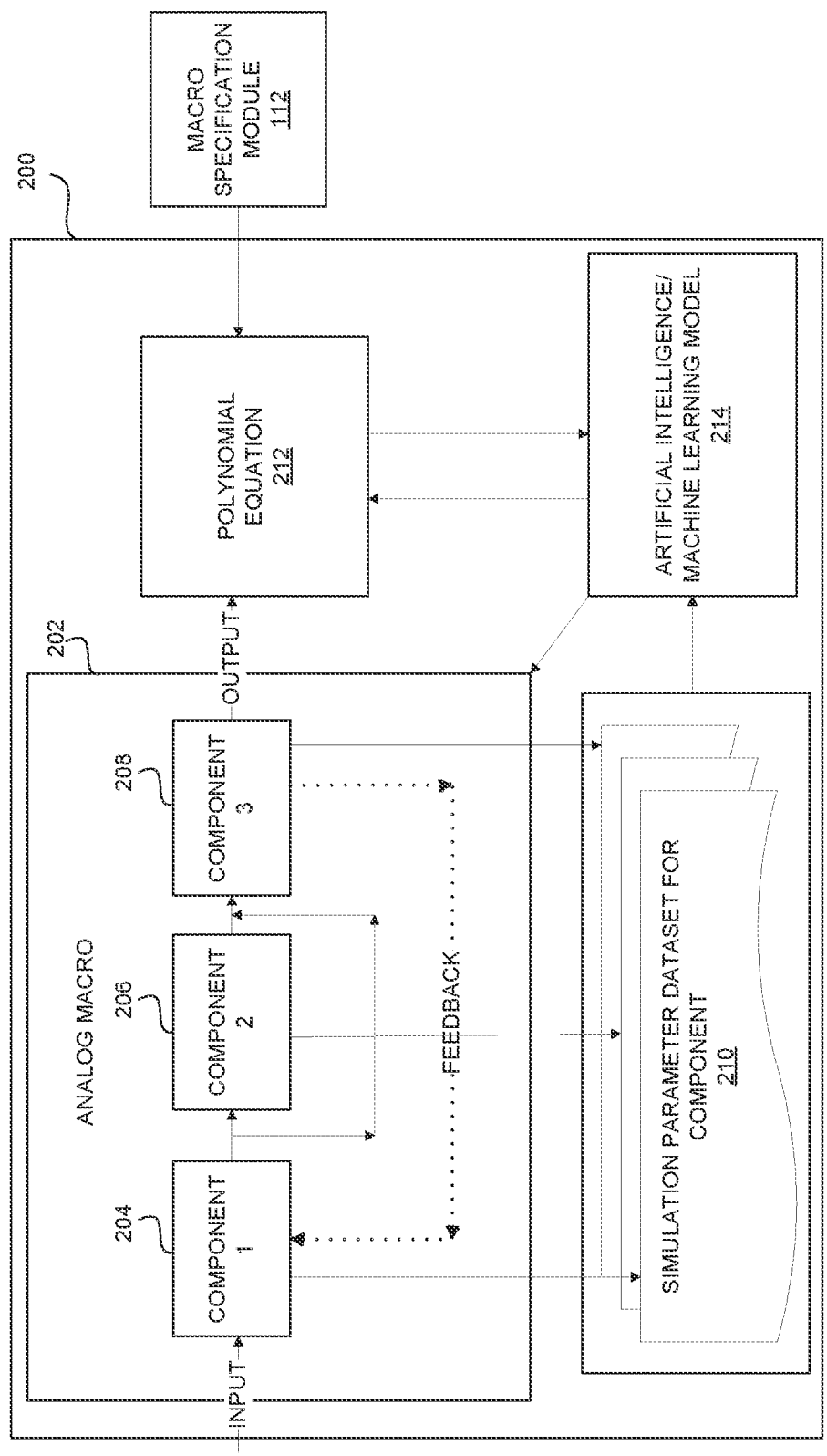
FIG. 2 illustrates an exemplary representation of training of the AI/ML model of FIG. 1 according to some embodiments herein.

FIG. 2 illustrates an exemplary representation 200 of training of an AI/ML model 214 of FIG. 1 according to some embodiments herein. The exemplary representation 200 of training the AI/ML model 214 includes an analog macro 202, leaf cells/components 204, 206, 208, a simulation parameter dataset 210, a polynomial equation 212, the AI/ML model 214, and a macro specification module 112. The analog macro 202 includes all the selected components under the same independent parameters. In some embodiments, the independent parameters include but are not limited to, a power, a voltage, or a temperature. The leaf cells/components 204, 206, 208 processes given input under independent and dependent parameters and provide outputs. In some embodiments, one or more leaf cells/components include independent and dependent parameters. In some embodiments, the one or more leaf cells have independent parameters in the analog circuit design synthesis include, for example, a supply voltage (V), a temperature (T), a width (W), a length (L) of each device and dependent parameters include, for example, biasing of one or more nodes, one or more current relationships.

In some embodiments, the dependent parameters are the same for all leaf cells/components. In some embodiments, the leaf cells/components are exposed to different parameter variations including, process, supply voltage, temperature conditions, and a simulation matrix for an elementary leaf cell that have many combinations of different parameter values, covered by running a regression of simulations. The simulation parameter dataset 210 stores simulation data of the dependent and independent parameters of each leaf cell/component. The polynomial equation 212 captures the overall specifications of the analog macro. In some embodiments, the polynomial equation 212 is driven by the AI/ML model. In some embodiments, the system adopts one or more polynomial equations. The AI/ML model 214 trains the analog design synthesis system to select suitable macro designs, maintain and select leaf cells/components in the library. In some embodiments, the AI/ML model 214 synthesize a custom design to implement effectively with maximum FoM. In some embodiments, the selection of suitable analog macro and its specification details is driven by the AI/ML model. In some embodiments, specification details decide the exact required components of the macro, for example, to construct an amplifier, choosing operational amplifier (op-amp) between a two-stage op-amp or a folded cascade op-amp is decided based on the specification details. In some embodiments, the analog macro includes one or more leaf cells. In some embodiments, the one or more leaf cells/components are converted into an accurate real-time model by (i) capturing a typical prototype and centering the design with an operating point well within the desired margin, and (ii) for typical design targeting, capturing its behavior across all possible combinations of direct and indirect factors from a different simulation. The macro specification derivation module 112 derives the specifications of selected analog macro and facilitates the polynomial equation 212 to capture all the specifications of macro and form a suitable polynomial equation from specifications to implement the behavioral model.

Figure 3:
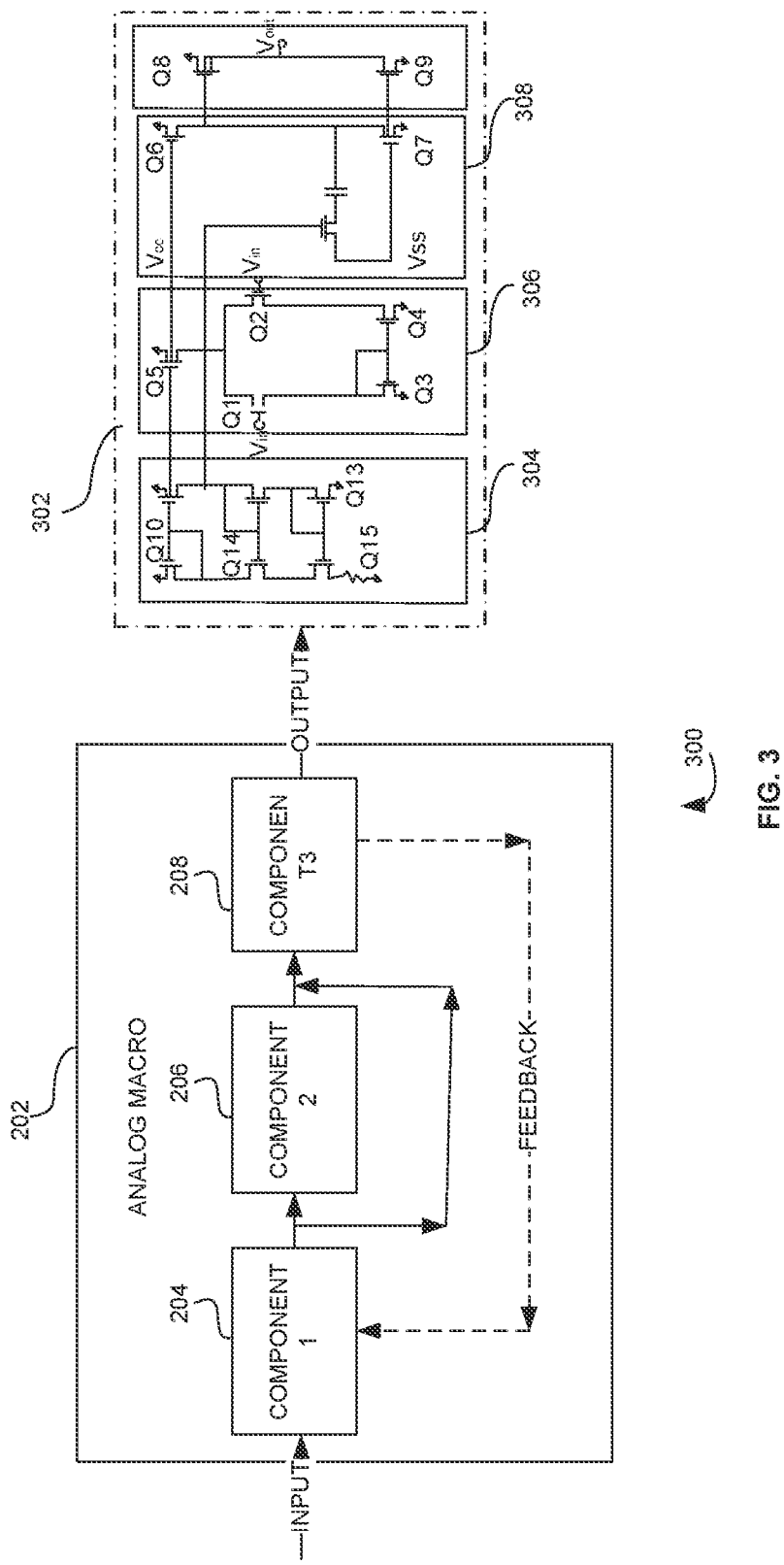
FIG. 3 illustrates an exemplary representation of the analog circuit design according to some embodiments herein.

FIG. 3 illustrates an exemplary representation 300 of an analog circuit design 302 according to some embodiments herein. The exemplary representation 300 includes the analog macro 202, the leaf cells/components 204, 206, 208, the analog circuit design 302. The leaf cells/components 204, 206, 208 process the given input under independent and dependent parameters and provide output. The analog circuit design 302 is a circuit design representation of the analog macro 202 with leaf cells/components. The analog circuit design 302 includes one or more leaf cells/components 304, 306, 308 as shown in the FIG. 3. In some embodiments, the one or more leaf cells/components include independent and dependent parameters. In some embodiments, the one or more leaf cells/components are converted into an accurate real-time model by (i) capturing a typical prototype and centering the design with an operating point well within the desired margin, and (ii) capturing its behavior across all possible combinations of direct and indirect factors from different simulations, for typical design targeting.

FIG. 4A illustrates an exemplary representation 400A of an analog macro according to some embodiments herein. The exemplary representation 400A depicts the analog macro that is included in a standard cell library. In some embodiments, the analog macro includes one or more leaf cells. In some embodiments, frequently used analog macros of the same type are classified in several prototypes based on circuit topology. In some embodiments, each prototype provides the same functionality but has different purposes that are suited for the end application. In some embodiments, each prototype uses different leaf level cells or the same cells used in other prototypes within a single macro family.

FIG. 4B illustrates an exemplary representation 400B of a leaf cell organization in an analog macro according to some embodiments herein. The exemplary representation 400B represents the leaf cell organization in the analog macro library. In some embodiments, the reuse of one or more leaf cells reduces design risk and improves design yield. In some embodiments, one or more leaf cells is used to implement the arithmetic functions for a generated default behavioral model. In some embodiments, frequently used analog macros of the same type are classified in several prototypes based on circuit topology. In some embodiments, each prototype provides the same functionality but has different purposes that are suited for the end application.

Figure 5:
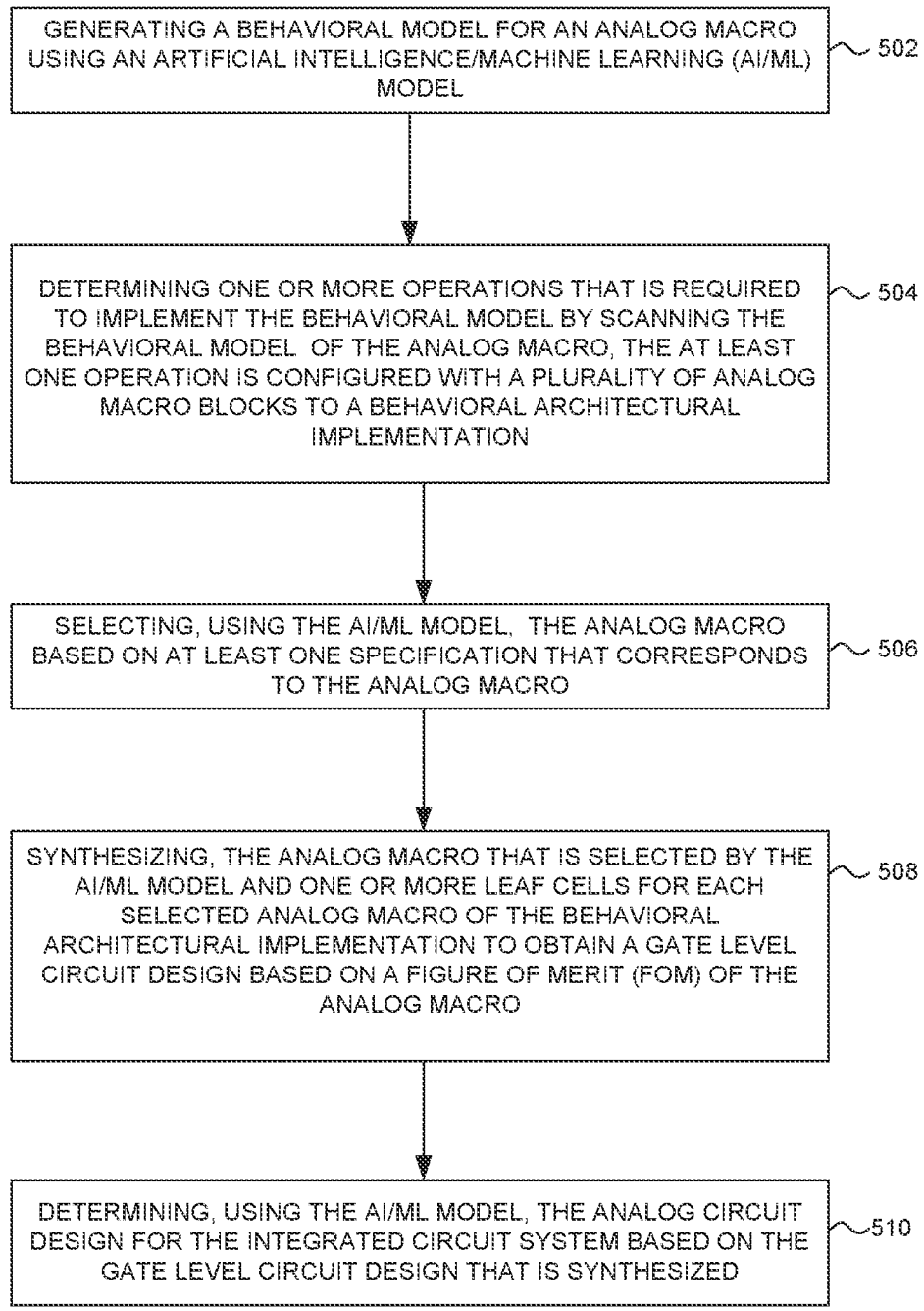
FIG. 5 is a flow diagram that illustrates a method for determining an analog circuit design for an integrated circuit system using an artificial intelligence/machine learning (AI/ML) model according to some embodiments herein.

FIG. 5 is a flow diagram that illustrates a method 500 for determining an analog circuit design for an integrated circuit system using an artificial intelligence/machine learning (AI/ML) model 214 according to some embodiments herein. At step 502, the method 500 includes the step of generating a behavioral model of an analog macro using the artificial intelligence and machine learning (AI/ML) model. At step 504, the method 500 includes the step of determining one or more operations that is required to implement the behavioral model by scanning the behavioral model of the analog macro, one or more operation is configured with one or more analog macro blocks to a behavioral architectural implementation. At step 506, the method includes the step of selecting, using the AI/ML model, the analog macro based on at least one specification that corresponds to the analog macro, the at least one specification includes required components for the analog macro, the analog macro includes one or more leaf cells. At step 508, the method includes the step of synthesizing, the analog macro that is selected by the AI/ML model, and one or more leaf cells for each selected analog macro of the behavioral architectural implementation to obtain a gate-level circuit design based on a figure of merit (FoM) of the analog macro, the analog macro that is selected is used for synthesizing whose FoM is above a threshold optimum FoM for the analog circuit design. At step 510, the method 500 includes the step of determining, using the AI/ML model, the analog circuit design for the integrated circuit system based on the gate level circuit design that is synthesized.

In some embodiments, the method further includes selecting layout views for each leaf cell of the analog macro and performing physical checks on the analog circuit design.

In some embodiments, the method further includes optimizing the FoM of the analog macro that is selected if the FoM of the analog circuit design is below the threshold optimum FoM to obtain an optimized analog macro.

In some embodiments, the method further includes classifying a frequently used analog macro of the same type in several analog circuit designs based on a circuit topology, each analog circuit design has the same functionality even though the frequently used analog macros are used for different purposes.

In some embodiments, the method further includes applying a functional verification to the gate level circuit design that is synthesized using the optimized analog macro.

In some embodiments, the method further includes training the AI/ML model 214 by correlating historical optimized analog macros with historical analog circuit designs based on the threshold optimum FoM.

In some embodiments, the method further includes converting one or more leaf cells for the analog circuit design into a real-time model by, (i) capturing a typical analog circuit design and centering the analog circuit design with an operating point within a desired margin; and (ii) for a typical design targeting, capturing its behavior across all possible combinations of direct and indirect factors from a different simulation.

In some embodiments, the method further includes generating a simulation matrix tree by running a regression of simulations in a pre-defined template, each leaf cell includes one or more inputs and outputs that expose to a different process, supply voltage, temperature conditions for each leaf cell.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A processor-implemented method for determining an analog circuit design for an integrated circuit system using an artificial intelligence/machine learning (AI/ML) model, the method comprising:
generating a behavioral model of an analog macro using the AI/ML model;
determining at least one operation that is required to implement the behavioral model by scanning the behavioral model of the analog macro, wherein the at least one operation is configured with a plurality of analog macro blocks to a behavioral architectural implementation;
selecting, using the AI/ML model, the analog macro based on at least one specification that corresponds to the analog macro, wherein the at least one specification comprises required components for the analog macro, wherein the analog macro comprises a plurality of leaf cells;
synthesizing, the analog macro that is selected by the AI/ML model and the plurality of leaf cells for each selected analog macro of the behavioral architectural implementation to obtain a gate level circuit design based on a figure of merit (FoM) of the analog macro, wherein the analog macro that is selected is used for synthesizing when the FoM of the analog macro is above a threshold optimum FoM for the analog circuit design; and
determining, using the AI/ML model, the analog circuit design for the integrated circuit system based on the gate level circuit design that is synthesized.

2. The processor-implemented method of claim 1, further comprising selecting layout views for each leaf cell of the analog macro and performing physical checks on the analog circuit design.

3. The processor-implemented method of claim 1, further comprising optimizing the FoM of the analog macro that is selected if the FoM of the analog circuit design is below the threshold optimum FoM to obtain an optimized analog macro.

4. The processor-implemented method of claim 1, further comprising classifying frequently used analog macros of same type in several analog circuit designs based on a circuit topology, wherein each analog circuit design has same functionality even though the frequently used analog macros are used for different purposes.

5. The processor-implemented method of claim 4, further comprising applying a functional verification to the gate level circuit design that is synthesized using the optimized analog macro.

6. The processor-implemented method of claim 1, further comprising training the AI/ML model by correlating historical optimized analog macros with historical analog circuit designs based on the threshold optimum FoM.

7. The processor-implemented method of claim 1, further comprising converting the plurality of leaf cells for the analog circuit design into real-time model by,
   capturing a typical analog circuit design and centering the analog circuit design with an operating point within a desired margin; and
   for a typical design targeting, capturing its behavior across all possible combinations of direct and indirect factors from a different simulation.

8. The processor-implemented method of claim 1, further comprising generating a simulation matrix tree by running regression of simulations in a pre-defined template, wherein each leaf cell comprises one or more inputs and outputs that expose to a different process, supply voltage, temperature conditions for each leaf cell.

9. A system for determining an analog circuit design for an integrated circuit system using an artificial intelligence/machine learning (AI/ML) model, the system comprising:
   a server that is communicatively coupled with a user device associated with a user, wherein the server comprises,
      a memory that stores a set of instructions; and
      a processor that executes the set of instructions and is configured to,
         generate a behavioral model of an analog macro using the AI/ML model;
         determine at least one operation that is required to implement the behavioral model by scanning the behavioral model of the analog macro, wherein the at least one operation is configured with a plurality of analog macro blocks to a behavioral architectural implementation;
         select, using the AI/ML model, the analog macro based on at least one specification that corresponds to the analog macro, wherein the at least one specification comprises required components for the analog macro, wherein the analog macro comprises a plurality of leaf cells;
         synthesize, the analog macro that is selected by the AI/ML model and the plurality of leaf cells for each selected analog macro of the behavioral architectural implementation to obtain a gate level circuit design based on a figure of merit (FoM) of the analog macro, wherein the analog macro that is selected is used for synthesizing when the FOM of the analog macro is above a threshold optimum FoM for the analog circuit design; and
         determine, using the AI/ML model, the analog circuit design for the integrated circuit system based on the gate level circuit design that is synthesized.

10. The system of claim 9, wherein the processor further configured to select layout views for each leaf cell of the analog circuit design and performing physical checks on the analog circuit design.

11. The system of claim 9, wherein the processor further configured to optimize selected macros, the specification of the macros, and the one or more leaf cells for each selected macro if the FoM of the analog circuit design is below the threshold optimum FoM.

12. The system of claim 9, wherein the processor further configured to classify frequently used macros of same type in different prototype based on a circuit topology, wherein each prototype has same functionality even though used for different purposes.

13. The system of claim 9, wherein the processor further configured to apply functional verification on the determined analog circuit design.

14. The system of claim 9, wherein the processor further configured to train the AI/ML model by correlating the optimized macros with historical analog circuit designs based on the threshold optimum FoM.

15. The system of claim 9, wherein the processor further configured to convert the plurality of leaf cells into an accurate real-time model by,
   capturing a typical prototype and centering the design with an operating point within a desired margin; and
   for a typical design targeting, capturing its behavior across all possible combinations of direct and indirect factors from a different simulation.

16. The system of claim 9, wherein the processor further configured to generate a simulation matrix tree by running regression of simulations in a pre-defined template, wherein each leaf cell comprises one or more inputs and outputs that expose to a different process, supply voltage, temperature conditions for each leaf cell.

17. One or more non-transitory computer-readable storage mediums storing one or more sequences of instructions, which when executed by one or more processors, causes a method for determining an analog circuit design for an integrated circuit system using an artificial intelligence and machine learning (AI/ML) model, the method comprising:
   generating a behavioral model of an analog macro using the AI/ML model;
   determining at least one operation that is required to implement the behavioral model by scanning the behavioral model of the analog macro, wherein the at least one operation is configured with a plurality of analog macro blocks to a behavioral architectural implementation;
   selecting, using the AI/ML model, the analog macro based on at least one specification that corresponds to the analog macro, wherein the at least one specification comprises required components for the analog macro, wherein the analog macro comprises a plurality of leaf cells;
   synthesizing, the analog macro that is selected by the AI/ML model and the plurality of leaf cells for each selected analog macro of the behavioral architectural implementation to obtain a gate level circuit design based on a figure of merit (FoM) of the analog macro, wherein the analog macro that is selected is used for synthesizing when the FoM of the analog macro is above a threshold optimum FoM for the analog circuit design; and
   determining, using the AI/ML model, the analog circuit design for the integrated circuit system based on the gate level circuit design that is synthesized.

* * * * *